United States Patent
Keshner et al.

(10) Patent No.: US 7,264,849 B2
(45) Date of Patent: Sep. 4, 2007

(54) ROLL-VORTEX PLASMA CHEMICAL VAPOR DEPOSITION METHOD

(75) Inventors: Marvin S Keshner, Mt View, CA (US); Warren B. Jackson, San Francisco, CA (US); Krzysztof Nauka, Redwood City, CA (US)

(73) Assignee: OptiSolar, Inc., Hayward, CA (US)

( * ) Notice: Subject to any disclaimer, the term of this patent is extended or adjusted under 35 U.S.C. 154(b) by 501 days.

(21) Appl. No.: 10/618,478

(22) Filed: Jul. 11, 2003

(65) Prior Publication Data
US 2005/0005851 A1 Jan. 13, 2005

(51) Int. Cl.
*H05H 1/24* (2006.01)
(52) U.S. Cl. .................. 427/569; 427/578; 427/8
(58) Field of Classification Search ............. 427/569, 427/570, 574, 578, 8
See application file for complete search history.

(56) References Cited

U.S. PATENT DOCUMENTS

| | | | | |
|---|---|---|---|---|
| 4,022,872 A | * | 5/1977 | Carson et al. | 423/297 |
| 4,689,129 A | * | 8/1987 | Knudsen | 204/157.41 |
| 4,690,830 A | * | 9/1987 | Dickson et al. | 438/96 |
| 4,897,282 A | * | 1/1990 | Kniseley et al. | 427/446 |
| 5,055,167 A | * | 10/1991 | Dummersdorf et al. | 204/165 |
| 5,242,530 A | * | 9/1993 | Batey et al. | 117/90 |
| 5,834,345 A | * | 11/1998 | Shimizu | 438/158 |
| 5,846,330 A | * | 12/1998 | Quirk et al. | 118/723 DC |
| 5,951,771 A | * | 9/1999 | Raney et al. | 118/723 ER |
| 6,352,910 B1 | * | 3/2002 | Harshbarger et al. | 438/482 |
| 2003/0143410 A1 | * | 7/2003 | Won et al. | 428/448 |
| 2004/0129212 A1 | * | 7/2004 | Gadgil et al. | 118/715 |

OTHER PUBLICATIONS

Watanabe, Takeshi et al., "Microwave-Excited Plasma CVD of a-Si:H Films Utilizing a Hydrogen Plasma Stream or by Direct Excitation of Silane". Japanese Journal of Applied Physics. vol. 26 (1987) pp. 1215-1218. Part 1, No. 8, Aug. 20, 1987. Abstract Only.*

* cited by examiner

*Primary Examiner*—Bret Chen
(74) *Attorney, Agent, or Firm*—Jeffrey Weiss; Weiss & Moy, P.C.

(57) ABSTRACT

A chemical vapor deposition method includes a step of maintaining a hydrogen plasma at low pressure in a processing chamber. The processing chamber has a long, wide, thin geometry to favor deposition of thin-film silicon on sheet substrates over the chamber walls. The sheet substrates are moved through between ends. A pair of opposing radio frequency electrodes above and below the workpieces are electrically driven hard to generate a flat, pancaked plasma cloud in the middle spaces of the processing chamber. A collinear series of gas injector jets pointed slightly up on a silane-jet manifold introduce 100% silane gas at high velocity from the side in order to roll the plasma cloud in a coaxial vortex. A second such silane-jet manifold is placed on the opposite side and pointed slightly down to further help roll the plasma and maintain a narrow band of silane concentration. A silane-concentration monitor observes the relative amplitudes of the spectral signatures of the silane and the hydrogen constituents in the roll-vortex plasma and outputs a process control feedback signal that is used to keep the silane in hydrogen concentration at about 6-7%.

14 Claims, 4 Drawing Sheets

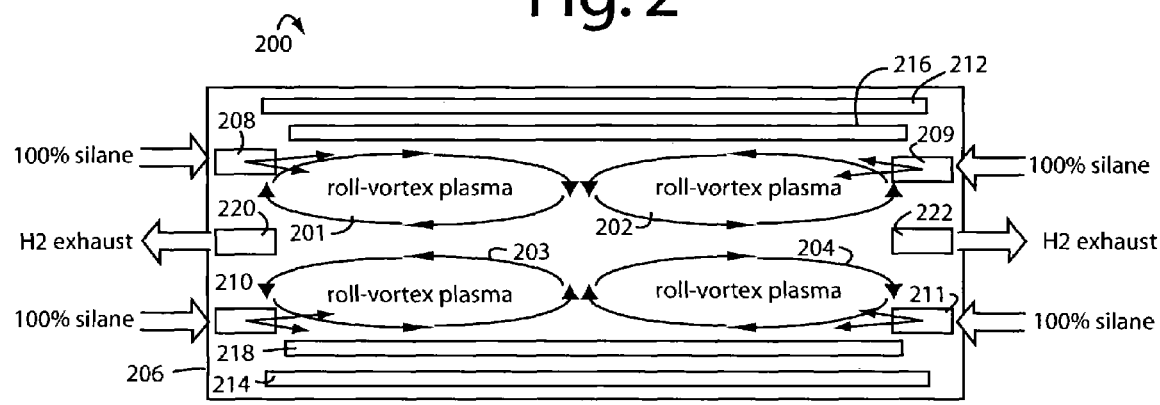
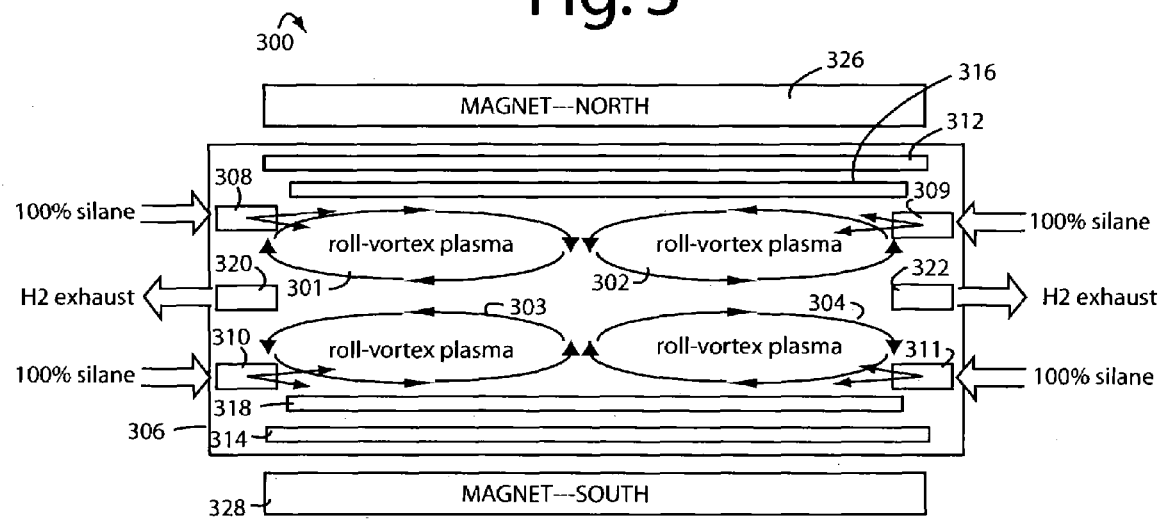

ROLL-VORTEX PLASMA CHEMICAL VAPOR DEPOSITION METHOD

FIELD OF THE INVENTION

The present invention relates to semiconductor manufacturing, and more specifically to methods for reducing the costs of fabricating large area thin-film devices like silicon photovoltaic cells.

BACKGROUND OF THE INVENTION

Plasma-enhanced chemical vapor deposition (PECVD) can be used to lay down high quality silicon on a variety of substrates. Lower workpiece temperatures can be used when the usual chemical vapor deposition (CVD) is augmented with a hydrogen plasma. Such plasma is typically heated between radio frequency (RF) electrodes, sometimes supplemented with a strong magnetic field to contain the plasma. The RF power, excitation frequency, silane ($SiH_4$) feed fraction, total gas pressure, gas composition ($H_2$ only or $H_2+Ar$) and electrode configuration all have some influence on the film crystallinity and growth rate.

In a prior art PECVD system, silane gas is introduced perpendicularly through showerheads to the plasma and it initially concentrates to about 7% silane in hydrogen. The silane concentration (SC) drops to about 5% as the silicon is deposited from the silane and is laid down on the workpiece. The depleted process gases are removed. The conversion of silane to silicon ($SiH_4 -> Si+2H_2$) frees additional hydrogen that must be pumped off to maintain the optimal pressure in the processing chamber. Unfortunately, the 5% silane is removed as well because such a low SC will adversely affect the quality of the silicon thin-film deposition. A lot of silane is wasted in conventional PECVD processing equipment in attempting to keep the wash of process gases at 6-7% silane concentration.

The bright promise of alternative forms of energy such as solar electric has not been fully accessed because the costs of solar photovoltaic cells and devices have been so high. A 100-watt solar electric panel can easily cost $500 or more. Gasoline, propane, and diesel driven electric generators still continue to be generally more attractive in terms of capital costs. Staying connected to the electric utility grid is still the only viable energy alternative for the vast majority of homes and businesses.

The cost of photovoltaic devices is too high because of the manufacturing methods currently in use. As a result, photovoltaic devices are finding only niche applications. Some of the high costs of photovoltaic devices have been the result of the tremendous waste of silane in conventional PECVD processes.

There are several conventional ways that photovoltaic devices are being presently fabricated. For example, new single crystal silicon wafers, scrap or re-claimed single crystal silicon, and thin-film deposition of photovoltaic devices on inexpensive substrates.

A typical thin-film photovoltaic device comprises several layers including a substrate, a barrier layer to isolate the thin-films from the substrate, an indium tin oxide or tin oxide transparent-conductor, a PIN photodiode structure, a second conductor such as ZnO and a metal conductor and reflector to trap light, an environmental protective coating, and a mounting system for strength and easy installation.

Plasma-enhanced chemical vapor deposition (PECVD) in a mostly hydrogen atmosphere is a conventional method for fabricating silicon, thin-film, PIN photodiode structures. Hydrogen atoms and radicals produced by the hydrogen plasma incorporate into the deposited silicon for good hydrogen passivation of the grain boundary defects and other dangling bonds. Such passivation is critical for the proper functioning of amorphous silicon and nano-crystalline PIN-diode structures.

The PECVD process generates a hydrogen plasma above a substrate using strong radio-frequency (RF) fields. The substrate is often heated, e.g., 200° C. A dilute silane (SiH), e.g., in concentrations of 5-10%, is introduced into the plasma and the result is a deposit of thin-film silicon on the substrate. Different RF frequencies are used, e.g., the industry standard 13.56 MHz, 95 MHz, and various microwave frequencies, each with their own advantages and disadvantages.

The typical PIN-diode structures fabricated with PECVD have typical sunlight-to-electricity conversion efficiencies of about 7% after several months of stabilization in sunlight. Unfortunately, the conventional PECVD deposition rates are slow, e.g., about 0.5 nm per second. Such slow rates are responsible for much of the high production costs of PIN-diode photovoltaic devices, as expressed in terms of fabrication costs per square meter, or per the peak power that can be generated by the device.

The efficiency of conversion of silane-to-deposited-silicon in conventional PECVD processes is poor, typically in range 5-15%. Most of the silane is wasted in the exhaust because it is simply blown through in an attempt to maintain the uniformity and the quality of the silicon being deposited. Prior art attempts to increase the deposition rates of silicon from silane using PECVD and hot-wire techniques have increased the deposition rates, but the quality of the deposited silicon was too poor to get high electric-conversion efficiency thin-film PIN-diode photovoltaic devices.

In a standard PECVD deposition system, the gas mixture (e.g. 6.5% silane in hydrogen); is introduced at one part of the chamber and then removed at another. A large flow rate is passed through the deposition chamber so that the silane concentration is not excessively depleted and reasonably uniform deposition parameters can be achieved (FIG. 2). For example, assume that the desired concentration of silane is 6.5%. To obtain the minimum possible flow rate of the gas mixture and the maximum utilization of silane, one would input a gas mixture that had 13% silane. As the gas mixture flowed through the plasma, the silane is consumed by the deposition such that the concentration at the output gas mixture is 0%. (See FIG. 2a) The total amount of input gas is just enough to supply the amount of silane consumed. Unfortunately, most deposition processes will not produce adequate silicon quality on the substrate with such a large variation in silane concentrations.

In standard PECVD systems, a much larger flow rate is used, instead. For example, the input mixture might be 7% silane and the flow rate set so that the concentration at the output is depleted to 6% silane. Such a high flow rate might provide adequate uniformity of the deposition parameters, but as a result, 6/7 of the silane is pumped out and wasted (FIG. 2). Tighter control of the variation in silane concentration would require yet higher flow rates and more waste. (For example, input 7%, output 6.5% would require twice the flow rate as above and would waste 6.5/7 or 93% of the silane). Thus, the material utilization is typically in the range of (5-15%).

In the formation of silicon films by CVD methods, there are additional problems. For example, production yield is low due to contamination of apparatuses or generation of foreign materials caused by silicon particles formed in a gas phase since gas phase reactions occur in CVD processes. A film having uniform thickness is difficult to obtain on a surface having concavo-convex areas since starting materials are gases. Productivity is low since the growth rates of films are low, and complicated and expensive high-frequency generators and vacuum apparatuses are required for plasma CVD. Accordingly, further improvements of formation of silicon films have been strongly desired.

In addition, handling of starting materials is difficult since not only are the gaseous forms of silicon hydrides used for CVD toxic and strongly reactive, but also a require a sealed vacuum apparatus. In general, the apparatus mentioned above is not only large and expensive, but also the vacuum system and/or plasma generation system of apparatus consumes large amounts of energy, resulting in further increases production cost.

SUMMARY OF THE INVENTION

An object of the present invention is to provide a system for improving the efficient use of silane in PECVD semiconductor equipment.

Another object of the present invention is to provide a system for reducing the fabrication costs of photovoltaic devices.

Briefly, a system embodiment of the present invention comprises a processing chamber for maintaining a hydrogen plasma at low pressure. The processing chamber has a long, wide, thin geometry to favor deposition of thin-film silicon on sheet substrates over the chamber walls. The sheet substrates are moved through between ends. The electric field for the plasma can be introduced by a pair of opposing radio frequency electrodes above and below the workpieces that generate a flat, pancaked plasma cloud in the middle spaces of the processing chamber. Alternately, thin rods can be placed along a line in the middle of the chamber and the RF field applied between the rods with the substrates at ground or a slight DC potential. A collinear series of gas injector jets pointed slightly up on a silane-jet manifold introduce 100% silane gas at high velocity from the side in order to roll the plasma cloud in a coaxial vortex. A second such silane-jet manifold is placed on the opposite side and pointed slightly down to further help roll the plasma and maintain a narrow band of silane concentration. 100% silane is flowed into the chamber at exactly the rate at which silane is consumed by the deposition process or exhausted with the gas mixture. Since hydrogen is produced by the deposition reaction at twice the rate of silane consumption, the exhaust gas is removed at roughly twice the rate at which silane is input. Feedback is used to adjust the input and exhaust gas rates to maintain the nominal silane concentration (5-10%) and the nominal pressure in the chamber. Since the input gas is 100% silane and since the exhaust gas flow is at twice the rate of the input flow and is at most 10% silane, more than 80% of the silane is re-circulated within the chamber and eventually used in the deposition reaction. A silane-concentration monitor observes the relative amplitudes of the spectral signatures of the silane and the hydrogen constituents in the roll-vortex plasma and outputs a process control feedback signal that is used to keep the silane in hydrogen concentration at about 6-7%. A particulate monitor is used to monitor particle formation and the information is used to adjust the silane/hydrogen ratio, pressure and RF power.

An advantage of the present invention is that a system is provided that can conserve the use of silane in a PECVD system.

Another advantage of the present invention is that a method is provided for reducing the manufacturing costs of photovoltaic devices.

These and other objects and advantages of the present invention will no doubt become obvious to those of ordinary skill in the art after having read the following detailed description of the preferred embodiment as illustrated in the drawing figures.

DESCRIPTION OF THE DRAWINGS

FIG. 2 is a lateral cross section of a PECVD system embodiment of the present invention that longitudinally induces four roll-vortex plasmas with strategically placed high velocity injections of 100% silane and hydrogen exhausts;

FIG. 3 is a lateral cross section of a lateral magnetic-influenced PECVD system embodiment of the present invention with roll-vortex plasmas similar to that of FIGS. 1 and 2;

DETAILED DESCRIPTION OF THE EMBODIMENTS

Figure 1:
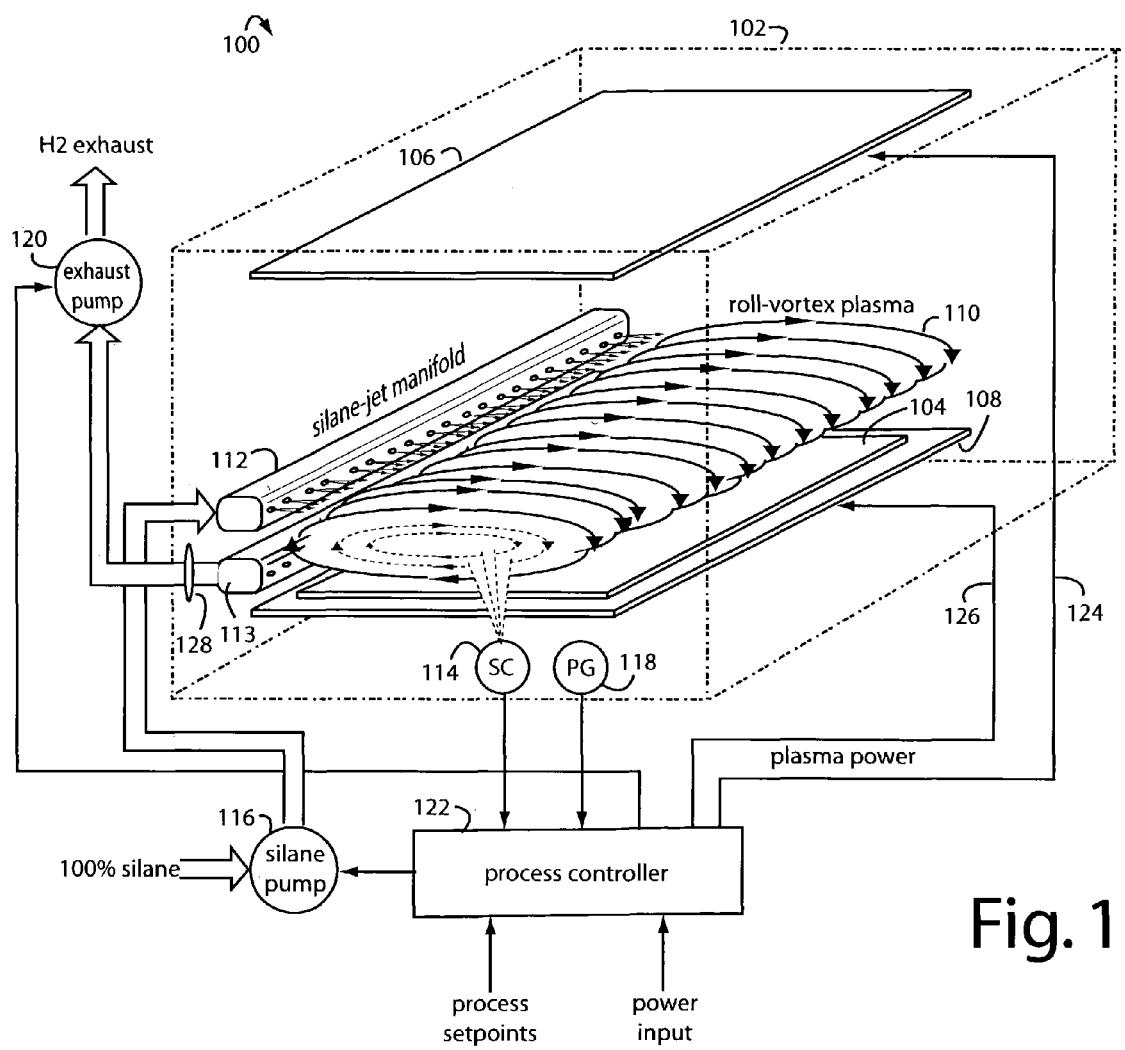
FIG. 1 is schematic and functional block diagram of a plasma-enhanced chemical vapor deposition (PECVD) system embodiment of the present invention.

FIG. 1 illustrates a PECVD system embodiment of the present invention, and is referred to herein by the general reference numeral 100. PECVD system 100 comprises a low-pressure chamber 102 in which a substrate workpiece 104 is transport perpendicular to the axis of roll-vortex plasma 110. A hydrogen atmosphere is introduced into the low-pressure chamber 102. A pair of radio frequency (RF) electrodes 106 and 108 are electrically driven to spawn a plasma 110. Such plasma 110 is rolled into a coaxial vortex by introducing high-velocity silane gas ($SiH_4$) at near 100% purity just off center from a longitudinal manifold 112. An exhaust manifold 113 assists in rolling the plasma 110 when it draws off excess hydrogen ($H_2$).

The silane concentration (SC) in the roll-vortex plasma 110 is maintained at about 6-7% silane-to-hydrogen by observing the relative amplitudes of fluorescence of the constituent gases with a monitor 114. More silane is jetted in by a pump 116 in order to maintain a setpoint silane concentration.

The pressure inside the chamber 102 is measured by a pressure gauge 118. Any excess pressure above a setpoint pressure is relieved by an evacuation pump 120.

The particulate level is measured by scattered light from a laser beam. The particulate level information is passed to the process controller 122.

In operation, a process controller 122 varies the excitation frequency and RF power amplitudes applied to the electrodes 106 and 108 through two cable feeds, 124 and 126. The RF power, plasma temperature, excitation frequency, silane ($SiH_4$) feed fraction, total gas pressure, and electrode configuration all have some influence on the film crystallinity and growth rate. The silane and hydrogen pump 116 and exhaust pump 120 are controlled according to process setpoints dialed-in by a user, and also by the silane concentration observed by monitor 114, the particulate monitor, and the chamber-pressure reported by pressure gauge 118.

The objective in generating the roll-vortex plasma 110 is to re-use the silane gas by keeping it resident. But if it is resident and active in the ongoing deposition of silicon, the SC of the plasma 110 cannot be allowed to drop below 6%.

A palladium filter 128 is used in front of the exhaust pump 120 to screen through only hydrogen gas. For example, to further reduce silane waste to less than 1%. But without such a screen, estimates are that the system 100 will have a silane utilization of about 85%. Such estimates are yet to be verified by experiments and tests.

The illustration of system 100 in FIG. 1 is a bit out of perspective in order to show the various parts here. It is preferable that the chamber 102 be very wide and long, yet thin, in order to maximize the ratio of the exposed areas of substrate workpieces 104 to those of the internal walls of the chamber. The substrate workpieces 104 are intended to be thin flat sheets of glass or metal that are used as substrate bases for large, inexpensive photovoltaic devices.

FIG. 2 is a lateral cross section of a PECVD system embodiment of the present invention that longitudinally induces four roll-vortex plasmas with strategically placed high velocity injections of 100% silane and hydrogen exhausts. Such PECVD system is referred to herein by the general reference numeral 200. A set of four roll-vortex plasmas 201-204 are developed within a hydrogen atmosphere in a chamber 206 by corresponding sets of injectors 208-211. Such jets consist of pairs of jets to introduce independently controlled pure silane and to exhaust the silane and hydrogen gas mixture. They are controlled to maintain about a 7% concentration of silane in each of the mostly-hydrogen roll-vortex plasmas 201-204. Each plasma is generated by an RF field induced between electrode plates 212 and 214. The object of the system is to deposit high quality thin films of silicon on upper and lower substrates 216 and 218. The strategic placement of two opposite exhausts 220 and 224 further contributes to the generation of the roll-vortex plasmas 201-204.

FIG. 3 is the lateral cross section of a lateral magnetic-influenced PECVD system embodiment of the present invention with roll-vortex plasmas similar to that of FIGS. 1 and 2. Such PECVD system is referred to herein by the general reference numeral 300. A set of four roll-vortex plasmas 301-304 are swirled in a chamber 306 by corresponding sets of injectors 308-311. Such jets introduce pure silane and are controlled to maintain about a 7% concentration of silane in each mostly-hydrogen roll-vortex plasma 301-304. The plasmas are generated by an RF field induced between electrode plates 312 and 314. The object of the system is to deposit high quality thin films of silicon on upper and lower substrates 316 and 318. The placement of two opposite exhausts 320 and 324 further contributes to the generation of the roll-vortex plasmas 301-304. A pair of magnets 326 and 328 are used to limit the movement of electrons and ions in the roll-vortex plasmas 301-304 so they move toward or away from the adjacent surfaces of the substrates 316 and 318.

Figure 4:
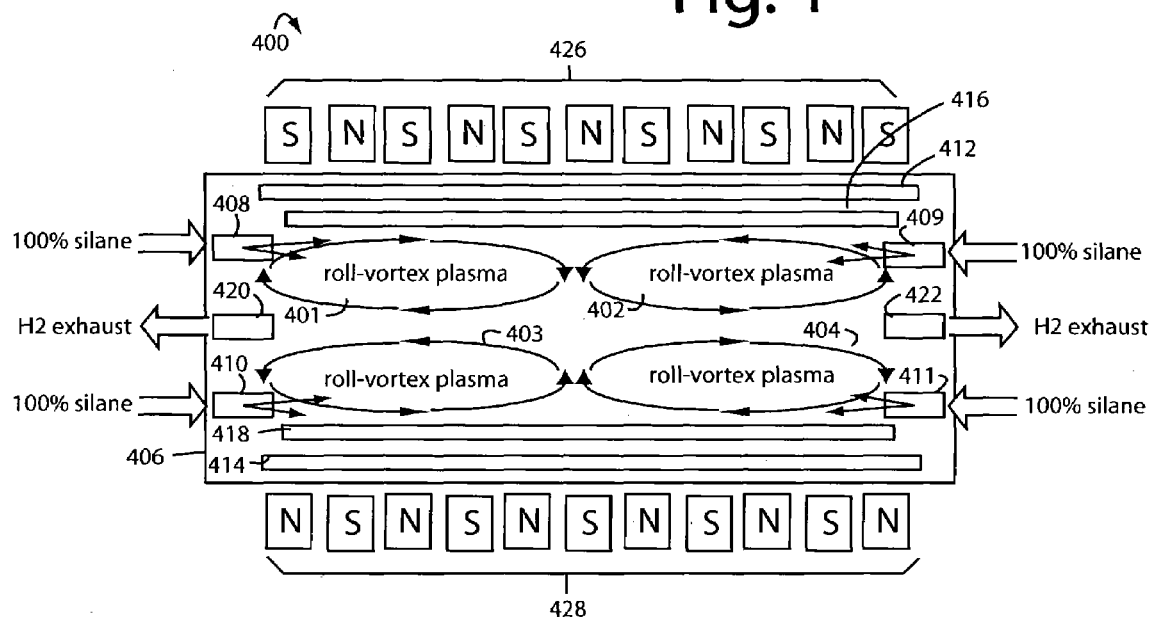
FIG. 4 is a lateral cross section of a longitudinal magnetic-influenced PECVD system embodiment of the present invention with roll-vortex plasmas similar to that of FIGS. 1 and 2.

FIG. 4 is a lateral cross section of a longitudinal magnetic-influenced PECVD system embodiment of the present invention with roll-vortex plasmas similar to that of FIGS. 1 and 2. The magnetic and RF electrodes confine the plasma for a more intense excitation. Such PECVD system is referred to herein by the general reference numeral 400. A set of four roll-vortex plasmas 401-404 are developed within a hydrogen atmosphere in a chamber 406 by corresponding sets of injectors 408-411. Such jets introduce pure silane and are controlled to maintain about a 7% concentration of silane in each mostly-hydrogen roll-vortex plasma 401-404. The plasmas are generated by an RF field induced between electrode plates 412 and 414. The object of the system is to deposit high quality thin films of silicon on upper and lower substrates 416 and 418. The placement of two opposite exhausts 420 and 424 further contributes to the generation of the roll-vortex plasmas 401-404. Alternating sets of magnets 426 and 428 are used, similar to FIG. 3, to limit the movement of ions and electrons in the roll-vortex plasmas 401-404 so they move toward or away from the adjacent surfaces of the substrates 416 and 418.

Figure 5:
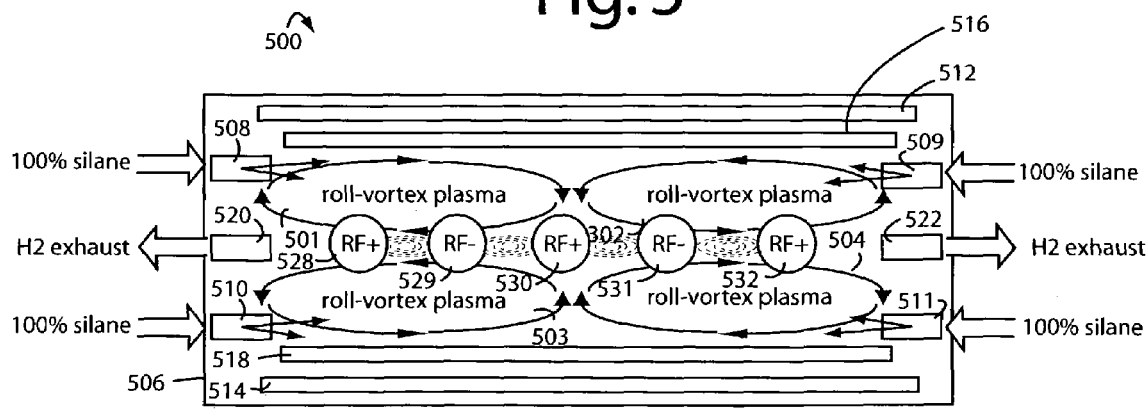
FIG. 5 is a lateral cross section of a PECVD system embodiment of the present invention with roll-vortex plasmas similar to that of FIGS. 1 and 2, wherein the plasmas are heated with high power radio frequency signals applied to a longitudinal electrode grille.

FIG. 5 is a lateral cross section of a PECVD system embodiment of the present invention with roll-vortex plasmas similar to that of FIGS. 1 and 2, wherein the plasmas are induced with high power radio frequency signals applied between elements of a longitudinal electrode grille. Such PECVD system is referred to herein by the general reference numeral 500. A set of four roll-vortex plasmas 501-504 are swirled in a hydrogen atmosphere in a chamber 506 by corresponding sets of injectors 508-511. Such jets introduce pure silane and are controlled to maintain about a 7% concentration of silane in each mostly-hydrogen roll-vortex plasma 501-404. A pair of heating plates 512 and 514 are associated with upper and lower substrates 516 and 518. The object of the system is to deposit high quality thin films of silicon on the inner surfaces of substrates 516 and 518. The placement of two opposite exhausts 520 and 524 further contribute to the generation of the roll-vortex plasmas 501-504. The plasmas are generated by an RF electrical field induced between electrode rods 528-532 arranged in a parallel grille.

In order to lower the manufacturing costs of photovoltaic devices, technologies common to other industries can be advantageously adapted to fabricate many of the necessary layers. Soda-lime glass, stainless steel, and various polymers have all been used as substrates for both evaporated and sputtered thin-films, and their respective costs are appropriately low. The glass industry has developed very low cost techniques including sputtering and evaporation to deposit thin-films of insulators, transparent conductors and metals onto glass. Similarly, the capacitor, flex circuit, window film and food packaging industries have developed very low cost techniques for sputtering and evaporation of thin films of insulators and metals onto a variety of flexible, polymer-based substrates.

Conventional manufacturing techniques are not well developed for mass producing large PIN photodiode structures. Such structures comprise silicon, or copper indium selenide, or cadmium telluride and are then finished with environmental encapsulation coatings, and mounting systems for installation.

A method embodiment of the present invention includes a low cost manufacturing technique for fabricating PIN photodiode structures with thin-film silicon. Semiconductor materials other than silicon can be used in specialized applications to optimize the recombination rate, trapping, and mobility characteristics necessary for efficient photovoltaic devices. Apart from the PIN photodiode uses of embodiments of the present invention, a wide variety of thin-film, silicon devices that require good mobility, low trapping and low recombination rates can benefit from the fabrication methods disclosed here.

Doping for the PIN layers can be done with a gas admixture of phosphine ($PH_3$) for the deposition of n-type layers, and trimethylboron ($B(CH_3)_3$) for the p-type layers. The crystalline volume content of the films can be adjusted by changing the deposition conditions, e.g., by varying the silane concentration in the source as mixture. Additional control of critical parameter can be obtained by introducing methane gas to add carbon to the silicon or germane gas to add germanium. The applied plasma power and plasma excitation frequency will also effect the point at which high crystalline volume fraction is maintained as silane concentrations are increased in the 6-10% range. See, O. Vetterl, et al., "Intrinsic Microcrystalline ASilicon: A new material for photovoltaics," Solar Energy Materials & Solar Cells 62(2000) 97-108.

One embodiment of the present invention include a low-cost deposition system that re-circulates the deposition gas mixture, adding inputs gas as it is used, and extracting the reaction products as they are created. By re-circulating the gas mixture, embodiments of the present invention have good gas mixture uniformity in the deposition chamber and very high input material utilization efficiencies. The simplicity, low deposition system costs, and the high input material utilization efficiency results in a breakthrough in the cost of producing silicon, thin-film, PIN-diode structures with adequate efficiency for converting sunlight into electricity.

Many embodiments of the present invention resemble conventional PECVD deposition systems. Silane (at 5-10%), and very small amounts of either diborane or phosphine for the p-type or n-type layers, are mixed in hydrogen as a source gas for the deposition system. An RF field is used to spawn a plasma in the source gas mixture. Typical deposition rates for silicon are very slow, e.g., 0.5 nanometers per second.

Embodiments of the present invention re-circulate the deposition chamber gas mixture, e.g., silane and small amounts of diborane or phosphine for the p-type or n-type layers. Additions to reaction gasses are matched to the rate at which they are consumed by the process. The gasses created by the deposition reaction are removed at the same rate they are produced. So, material utilization can ideally approach 100%. Of course, some silane will be lost in the exhaust because it cannot be fully blocked from escaping, and some other silane will be consumed in unwanted byproducts that must be removed to avoid contamination.

Within the chamber, a circulating gas flow plus the effects of gaseous diffusion maintain a low variation in the concentration of reaction gasses. The gas concentration and the pressure of the gas mixture within the deposition chamber are both monitored continuously by sensors. Feedback is used to adjust the rate of adding input and extracting output gasses to maintain a steady pressure and a steady concentration of the reaction gasses.

The decomposition of Silane to produce and deposit silicon proceeds according to the following reaction: $SiH_4$ (in the hydrogen plasma)$-\to Si$ (with a small % of trapped hydrogen)$+2H_2$. The reaction consumes input silane plus the small amounts of diborane or phosphine for the p-type and n-type layers, and generates hydrogen as an output gas. Therefore, to maintain a steady pressure and steady concentration of the gas mixture within the chamber, the input silane+ gas should be replaced at the deposition rate and hydrogen extracted at approximately twice the deposition rate. The input silane+ gas has 100% concentration. The output gas, hydrogen, is extracted through a filter that preferentially passes hydrogen and blocks other gases, e.g., to prevent dumping of the silane. The gases that not pass through the filter stay in the chamber and are re-circulated.

The filter to remove the output gas, hydrogen, does not have to pass only 100% pure hydrogen. The gas mixture in the chamber is typically about 6-7% silane+ and 94-93% hydrogen. If the filter is able to concentrate the hydrogen to 99%, then given that the deposition reaction produces two molecules of hydrogen for every molecule of silane consumed, approximately 2% of silane would then be pumped out of the deposition chamber along with the hydrogen output gas. Such very slight 'waste' would still allow for very high utilization of the input gasses—as high as 98%. It has the additional advantage, that slight amounts of unwanted gas could also be removed from the system along with the hydrogen output gas.

The filter is a thin sheet of palladium metal which is well known for its ability to pass hydrogen while resisting other gasses. Alternately, since hydrogen is much lighter than any of the other gasses, a filter based on its lower viscosity and higher diffusion rate can be used.

Alternatively, exhaust gas is removed from the re-cycled mixture within the chamber without using such a filter. Removing gas at approximately two-times the rate at which input is introduced would keep the re-cycled mixture in steady state. Without any filter, the removed output gas is approximately 6-7% silane+. Thus, about 12-14% of the input silane gas is wasted and pulled out in the output gas mixture. The pressure and concentration of the re-cycled gas mixture within the deposition chamber is precisely controlled by continuous monitoring and by a feedback control system that would adjust the input and output gas flow rates. In this case, the utilization efficiency of the input gases is 86-88%, which is still much, much better than is typical in the industry.

Removing gas without any filter has two significant advantages. First, it provides faster removal of unwanted gas, e.g., vacuum leaks and plasma reaction "junk". Second, it allows measurement of the gas concentrations outside of the chamber rather than inside. Such could simplify the design and lower the cost of the concentration sensor.

Further improvement of the utilization efficiency by which silane+ produces deposited silicon on the substrate results from the construction of the deposition chamber. Substrates are positioned on both sides of a chamber that is thin between the substrates, when compared with the other two dimensions. The gas mixture is introduced between the substrates and the RF field that produces the plasma is applied from behind each substrate. The plasma and gas mixtures will deposit silicon in both directions. Since substrates are on both sides, most of the deposited silicon will be on one of the substrates, rather than the walls of the chambers. By geometric design, the area of the top, bottom and two sides is much, much smaller than the surface area of the two substrates. Only at the walls at the top, bottom and two sides of the chamber will be exposed to the plasma and possibly accumulate deposited silicon from the plasma.

The amount of silicon that is deposited onto the top, bottom and sides of the chamber can be further minimized by restricting the area of the RF plates, which are located behind each of the substrates, or the grille of rods in the center to less than the full length or height of the chamber. The top, bottom and sides can be coated with a material, e.g., TEFLON, that resists the deposition of silicon and for which the atomic and ionized hydrogen from the plasma remove silicon as fast as it is deposited.

The use of magnetic fields to direct and comprise the plasma is illustrated in FIGS. 3 and 4. The amount of silicon that is deposited onto the top, bottom and sides of the chamber can be minimized through the use of magnetic fields that influence the RF plasma. The effect of the magnetic field is to cause ions in the plasma to travel perpendicular to the substrates. So a minimum of material is deposited.

The efficient utilization of silane+ can be greatly enhanced by arranging two substrates with a very small space between them for the plasma and gas mixture. However, making this dimension too small works against keeping a uniform concentration of silane+ in the chamber, and against being able to re-circulate the gas mixture as new gas is added and output gas is removed.

FIGS. 1-6 show the input gas being introduced at high velocity by jets. Two strings of input gas jets can be arranged on each side, four strings of jets in all, as in FIGS. 2-6. The geometry of the inputs and outputs, and the velocity of the input gas, creates four re-circulating currents in the gas mixture within the deposition chamber. Such currents cause the gas to re-circulate at a flow rate such that only a small % of the silane+ is consumed in each round trip through the chamber. Turbulent flow can be avoided at the low flow rates, and the low gas pressure required, e.g., 300 mtorr.

A rapid diffusion of the silane+ occurs because the gas mixture is mostly hydrogen. The concentration gradients between the substrates are minimal. Longitudinal concentration variations can be controlled by the gas re-circulation velocity within the chamber. The input and output gasses are introduced and extracted uniformly from top to bottom to avoid variations.

The slight variations from side to side in the long direction will affect the deposition rate, but not the silicon quality. The substrates are moved in the long direction. In the moving across the deposition chamber, every location on the substrate will experience and average over any side-to-side non-uniformity in the deposition rate. Thus, the side-to-side variations only need to be controlled to be within the range allowed for obtaining good properties for the deposited silicon.

In FIGS. 2-6, two exhaust pipes are used remove output gasses, e.g., one on opposites sides of the chamber along the middle mid-way between the substrates. If used, a filter for concentrating the % of hydrogen in the output gas would be placed between the gas mixture and the openings of the output pipes. Exit gas velocities assist in supporting the current flow that re-circulates the gas mixture within the deposition chamber.

A gas mixture of 5-10% silane+ in hydrogen that is continuously re-circulated through an RF plasma may start to create chains of silicon and hydrogen and might even start to create polymers by cross-linking chains. Fortunately, there is a great abundance of hydrogen in the gas mixture and the plasma region. The reactive mono-atomic hydrogen and hydrogen ions formed in the plasma can reach the walls on the top, bottom and sides of the chamber and scavenge chains or polymers to convert such back into silane+. If necessary, a catalyst such as Pt, Pd or Ni, can be introduced to further encourage hydrogenation.

When crystalline structure depositions are not needed, a variety of techniques are available to artisans to deposit oxides and metals. To further minimize the overall cost of depositing all of the layers of a complete photovoltaic structure, the elimination of load-locks is required. Load-locks slow production down because substrate loading and unloading is needed between subsequent stages. The total cost can be significantly reduced by eliminating several load-locks, and the associated vacuum pumping and substrate handling.

The system is modified for depositing metals or metal oxides with a PECVD system and a mostly hydrogen atmosphere. Rods of the metal component of the deposition are placed through the center of the deposition with the two substrates on either side. For the silicon deposition, the RF field is applied from behind the substrates and through the center of the deposition chamber. Or, the RF field is applied between the metal rods that traverse the center of the deposition chamber. Every other rod has an applied RF that is out of phase so that a plasma is generated in the gaps between all rods. The geometry is controlled such that there is a strong hydrogen plasma between the rods that diminishes significantly moving from the center of the deposition chamber towards the surface of each substrate.

The difference in intensity of the plasma at the metal rods compared with at the substrate will encourage removal of material from the rods and deposition onto the substrates. Also, the rods may be heated or allowed to run hot to increase the deposition rate. The gas mixture may also include a gas that reacts with the metal to form gaseous products (e.g. HCL). Such gas would not be consumed by the deposition process, but would facilitate the transport of the metal from the rods to the substrate. For deposition of oxides, $H_2O$ is the input gas. Hydrogen is the output gas, as before.

Deposition rates are similar to those for silicon, 0.5 nanometers per second, which is very low. But, the deposition is very simple and low cost. In addition, since all depositions are done in a mostly hydrogen atmosphere at the same pressure and temperature, the chambers can be concatenated with only baffles and/or regions of no deposition buffer zones between them. Therefore, load-locks would not be required between areas of different material depositions.

In one embodiment of embodiment of the present invention, individual deposition chambers are linked together to form a continuous deposition system. Substrates are either sheets or rolls of thin material, e.g., few mils in thickness. For either the sheet or the roll design, substrate materials are glass, stainless steel, nickel-iron or various plastics. Separating adjacent chambers is a baffle with close spacing to each the substrates. The close spacing between the edge of the baffle and the surface of the substrate minimizes the gas flow between chambers. In addition, the pressure in adjacent chambers is carefully controlled by the feedback system mentioned in the section above to minimize the pressure gradient between the two chambers and further minimize gas flow between the chambers.

At the beginning of the set of linked deposition chambers is a load lock for the loading of substrates and pumping out room gasses. At the end is another load lock for the removal of the substrates with the deposited layers, and for their return to room air without introducing room air into the deposition chambers.

The movement of gas from one deposition chamber to the next through the baffle can be further reduced with a three-chamber baffle. The middle chamber of the baffle is filled with hydrogen at a pressure greater than the pressure in the deposition chambers on either side of the baffle. The outer two chambers of the baffle are pumped to remove the hydrogen flowing in from the middle baffle chamber. The output pump rate in the two outer baffle chambers is controlled by feedback so that the pressure in both of the outer chambers is equal to the pressure in the neighboring deposition chamber. As a result, the gas flow at the edge of the baffles next to the substrates is from the center baffle chamber towards the outer baffle chambers. Gas that leaks from a deposition chamber into either of the outer baffle chambers will tend to be pumped out of the system. The flow rate of hydrogen into the middle baffle chamber and out of the two outer baffle chambers can be adjusted to obtain the desired reduction in any gas leaking from one of the deposition chambers into the baffle.

For very sensitive transitions, such as from deposition of the p-type layer to deposition of the intrinsic layer (i-silicon), a chamber can be inserted in which the input and output gasses were only hydrogen and for which no RF field was applied. Such would allow escape time for the gas molecules that were adhered to the surface of the substrate. Also, it would further isolate the gas mixture for the p-type silicon from the mixture for the i-silicon.

For deposition of intrinsic silicon, any dopant gases that leak from adjacent chambers can be compensated by introducing an equal amount of the opposite dopant gas. The concentration of dopant gas is measured. Then, feedback is used to adjust the amount of compensating dopant gas that is added. The result is equal effective concentrations of the p-type and n-type dopants so that the deposited material will be intrinsic silicon.

RF power may be applied to metal plates located immediately behind each substrate. Such creates an RF field perpendicular to the surface of the substrates, and in the gas mixture that is in the area between the substrates. Depending on the frequency of the RF and the size of the plates, more than one attachment from the RF generator to each plate may be required to avoid non-uniformities in the power density of the plasma.

A multi-layer structure with a series of depositions in a single in-line system, without load-locks between depositions, could use a PE CVD hydrogen plasma approach for all depositions.

High material utilization can be obtained by re-circulating the gas mixture within the deposition chamber for both high material utilization and tight concentration control. This is done by sensing the pressure and concentration of the gases in the gas mixture and then maintaining a uniform steady-state gas mixture with feedback control. A cloud of re-circulating gases within the chamber is generated with a high velocity jet of input gases. The high velocity jets of input gas supply almost pure reactant gases at roughly the deposition usage rate. The exhaust gas removes reaction products at roughly the rate that they are produced by the deposition. Since the gas mixture is held at 93% hydrogen, even with no filtering the exhaust is removing mostly hydrogen. The output gas can be filtered through to concentrate hydrogen to improve the reactant gas utilization even further. Depositing on two substrates at once minimizes the exposed wall area. A long, wide and thin plasma region is constructed so the substrates can be arrayed on both sides. Various magnetic fields can be used to directionalize the deposition and avoid depositing on the walls. The plasma geometry is designed to scavenge silicon, silicon chains or silicon polymers off the walls. Catalyzing the decomposition of silicon chains or polymers can be helpful in the process. A variety of materials can be used on the inside walls to discourage silicon deposition.

A low-cost deposition system embodiment of the present invention uses baffles, rather than load locks to minimize the gap between deposition chambers and limit the flow of gas mixture from one chamber to the next. Multi-chamber baffles with hydrogen supplied in the center and pumped from outside chambers are used to remove gas from a deposition chamber leaking into the baffle. Deposits are made on two substrates at once. Hydrogen plasma depositions are used for all material depositions so that the deposition chambers can be run at the same pressure and baffles between them provide sufficient isolation of one gas mixture from the next. Hydrogen plasmas are used for all depositions in the plasma chambers to eliminate load locks between deposition chambers. Any dopants that leak into a chamber designated for intrinsic silicon deposition are measured, and opposite dopants are added to compensate so the effective net concentration of dopants is nearly zero. A continuous deposition for steady state conditions is used for gas mixtures and to minimize the vacuum pumping required by re-circulating most of the gas mixture to minimize vacuum pumping.

Figure 6:
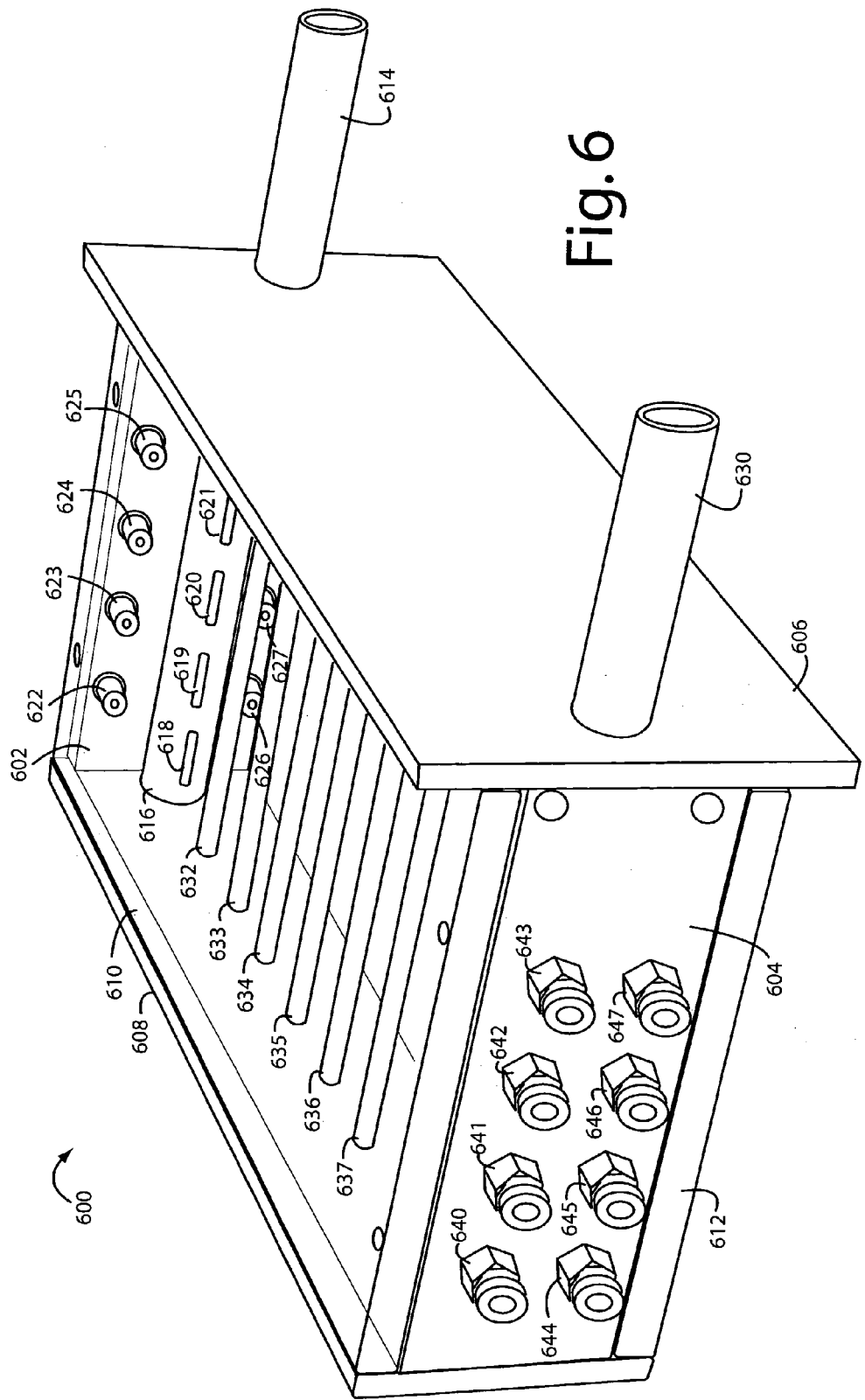
FIG. 6 is a perspective diagram of a PECVD system embodiment of the present invention with roll-vortex plasmas similar to that of FIGS. 1 and 2, wherein the plasmas are heated with high power radio frequency signals applied to a laterally oriented electrode grille.

FIG. 6 illustrates a prototype of a PECVD system embodiment of the present invention, and is referred to herein by the general reference numeral 600. Such was used to prove various principles of operation. The PECVD system 600 comprises a low-pressure chamber constructed of a right aluminum side plate 602, a left aluminum side plate 604, a front aluminum plate 606, a rear polycarbonate cover 608, a top polycarbonate cover 610, and a bottom polycarbonate cover 612. An exhaust pipe 614 draws out spent gases from a right internal exhaust manifold 616. Such gases are evacuated out, e.g., on the right side, from the chamber's internal volume through a series of slots 618-621. A similar series exists for the left side, but the perspective of FIG. 6 does not allow their illustration.

The positioning and shape of these slots 618-621 contribute to a particular swirl that is deliberately imparted to a silane-plasma cloud generated inside. E.g., as illustrated more schematically in FIG. 5 with four separate swirling roll-vortex plasma clouds. A series of injector nozzles 622-625, and 626-627, further assist in the silane-plasma cloud swirl. More such injector nozzles exist in system 600, but the perspective of FIG. 6 does not allow their illustration. A left side exhaust pipe 630 connects internally to a left side exhaust manifold.

The PECVD system 600 further comprises a series of electrodes 632-637 that are driven hard electronically to generate a plasma from the hydrogen gas that surrounds them in the chamber. A series of left side injector connections 640-647 are matched by others on the right side that are out of view in the perspective of FIG. 6. Since PECVD system 600 is a proof of concept prototype, there is no mechanism provided here to introduce and process substrates for thin-film deposition.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of thin-silicon chemical vapor deposition (CVD), comprising:

spawning a hydrogen plasma cloud proximate to a workpiece substrate in a deposition chamber with an RF-field generator;

injecting a gas into said hydrogen plasma cloud during operation from a silane input so as to roll said hydrogen plasma cloud into a coaxial vortex;

injecting p-type impurities, n-type impurities, or no impurities into said hydrogen plasma cloud during operation which provides for alternative deposition of p-type, n-type, and intrinsic silicon layers having substantially equal effective concentrations of said p-type and n-type impurities, respectively, on said workpiece substrate; and receiving a deposition gas mixture from said deposition chamber through an exhaust system;

wherein, a controlled pressure and a consistent concentration of said silane gas is provided for in said hydrogen plasma cloud during operation.

2. The CVD method of claim 1, further comprising: admitting silane and impurity dopant gases at their respective inputs at a rate that matches their consumption from said hydrogen plasma during deposition.

3. The CVD method of claim 1, further comprising: exhausting said gas mixture in said chamber at a rate that matches said rate at which reaction products are generated in said deposition process.

4. The CVD method of claim 1, further comprising: selectively passing only hydrogen with a filter before exhausting said system to prevent silane input gasses from being wasted.

5. The CVD system of claim 1, further comprising: continuously monitoring said deposition gas mixture in said deposition chamber with a sensor, and providing a feedback signal that can be used to maintain a particular pressure and a specific concentration of reaction gasses.

6. The CVD method of claim 1, further comprising: providing a feedback control system that receives inputs from sensors that measure gas pressure, gas concentrations, gas temperature, RF power level, and that adjusts a gas input and a gas exhaust rate, an RF-power level, and a gas temperature to maintain particular deposition conditions.

7. The CVD method of claim 1, further comprising: separating multiple chambers with different gas mixtures in each chamber by baffles and buffer regions to minimize a bypass gas flow between chambers.

8. The method of claim 1 wherein said deposition gas mixture is received from said deposition chamber through said exhaust system at approximately twice a rate at which said gas is injected into said hydrogen plasma cloud.

9. The method of claim 1 further comprising inducing a plurality of roll-vortex plasma clouds within said deposition chamber.

10. The method of claim 1 wherein said gas comprises approximately 100% silane.

11. The method of claim 1 wherein said step of injecting said gas further comprises:

injecting said gas from a first series of gas injector jets pointed upward in relation to said workpiece substrate; and injecting said gas from a second series of gas injector jets pointed downward in relation to said workpiece substrate.

12. The method of claim 11 wherein said first series of gas injector jets are collinear.

13. The method of claim 11 or 12 wherein said second series of gas injector jets are collinear.

14. The method of claim 1 or 11 further comprising recycling said deposition gas mixture received through said exhaust system so as to capture unused silane and to return said silane to be available to be injected into said hydrogen plasma cloud.

* * * * *